US012685115B2

(12) United States Patent
Li et al.

(10) Patent No.: US 12,685,115 B2
(45) Date of Patent: Jul. 14, 2026

(54) GROWTH SUPPRESSION DEPOSITION FOR CVD TUNGSTEN GAP FILL WITH THERMAL TREATMENT

(71) Applicant: Applied Materials, Inc., Santa Clara, CA (US)

(72) Inventors: Yang Li, Sunnyvale, CA (US); Peiqi Wang, Campbell, CA (US); Kai Wu, Palo Alto, CA (US); Dongming Iu, Union City, CA (US); Xiaozhou Yu, Santa Clara, CA (US); Insu Ha, San Jose, CA (US); Meng Zhu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 380 days.

(21) Appl. No.: 18/425,408

(22) Filed: Jan. 29, 2024

(65) Prior Publication Data

US 2025/0246482 A1 Jul. 31, 2025

(51) Int. Cl.
H10W 20/00 (2026.01)
C23C 16/04 (2006.01)
(Continued)

(52) U.S. Cl.
CPC ......... H10W 20/076 (2026.01); C23C 16/045 (2013.01); C23C 16/14 (2013.01);
(Continued)

(58) Field of Classification Search
None
See application file for complete search history.

(56) References Cited

U.S. PATENT DOCUMENTS 11,482,452 B2 * 10/2022 Yoon ................... H10W 20/045
2006/0043473 A1 3/2006 Eppich
(Continued)

FOREIGN PATENT DOCUMENTS

| CN | 104641456 A | 5/2015 |
| CN | 113964010 A | 1/2022 |
| WO | 2022232995 A1 | 11/2022 |

OTHER PUBLICATIONS

International Search Report and Written Opinion dtd May 21, 2025 for Application No. PCT/US2025/012001.
(Continued)

*Primary Examiner* — Bilkis Jahan
(74) *Attorney, Agent, or Firm* — Patterson + Sheridan, LLP

(57) ABSTRACT

Embodiments of the disclosure provided herein include systems and methods for forming low resistivity tungsten features in a semiconductor device manufacturing scheme using growth suppression techniques. The system includes a processing chamber, a gas delivery system, and a system controller configured to expose at least one opening formed in a multi-tier structure of a substrate to a tungsten-containing precursor and a nucleation reducing agent. The tungsten-containing precursor and the nucleation reducing agent are alternated cyclically to form a nucleation layer within the at least one opening of the substrate. The system controller is further configured to expose the at least one opening of the substrate to a nitrogen-containing gas, a tungsten-containing gas, and a gapfill reducing agent gas to produce a non-uniform tungsten nitride passivation layer in the at least one opening.

20 Claims, 9 Drawing Sheets

(51) Int. Cl.
    *C23C 16/14*         (2006.01)
    *C23C 16/455*      (2006.01)
    *C23C 16/56*        (2006.01)

(52) U.S. Cl.
    CPC ........ *C23C 16/45527* (2013.01); *C23C 16/56*
           (2013.01); *H10W 20/056* (2026.01)

(56)            References Cited

U.S. PATENT DOCUMENTS

| | | | |
|---|---|---|---|
| 2008/0008823 A1* | 1/2008 | Chen ................... | H10W 20/037 |
| | | | 257/E21.171 |
| 2010/0028230 A1* | 2/2010 | Gady ...................... | F01N 3/208 |
| | | | 422/171 |
| 2011/0305074 A1 | 12/2011 | Lung et al. | |
| 2013/0023095 A1 | 1/2013 | Nojima | |
| 2014/0239244 A1 | 8/2014 | Pellizzer et al. | |
| 2021/0090948 A1* | 3/2021 | Chen ................... | H10W 20/057 |
| 2021/0327881 A1 | 10/2021 | Tang et al. | |

OTHER PUBLICATIONS

International Search Report and Written Opinion PCT/US2023/081138.

\* cited by examiner

GROWTH SUPPRESSION DEPOSITION FOR CVD TUNGSTEN GAP FILL WITH THERMAL TREATMENT

BACKGROUND

Field

Embodiments of the present invention generally relate to methods used in semiconductor device manufacturing, and more particularly, to methods used for forming tungsten features in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below).

Due to its relatively low resistivity, tungsten is also commonly used to form bit lines and word lines used to address individual memory cells in a memory cell array of a three-dimensional NAND (3D NAND) device. 3D NAND structures include tiers of horizontal arrays that can be stacked by depositing layers in sequence. Channels can be formed through the stack of films and filled with tungsten. In some cases, the channel sidewall widths can vary between tiers. During filling of the channel, the tungsten fill layer can deposit an upper portion of the channel quicker than a lower portion due to the varying channel sidewall widths and higher concentration of precursor gases used to deposit the tungsten fill layer. This can cause void formation within portions of the channels, particularly for channels disposed in structures having two or more tiers, and particularly for high aspect ratio features.

Accordingly, there is a need for processes to fill contact features that are free or substantially free of voids and seams, and have low resistivity for various film thicknesses within channels in multi-tier structures.

SUMMARY

Embodiments described herein are generally directed to systems and methods for forming low resistivity tungsten features in a semiconductor device manufacturing scheme using growth suppression techniques.

In an embodiment, a substrate processing system is provided. The substrate processing system includes a processing chamber, a gas delivery system fluidly coupled to the processing chamber, and a system controller configured to expose at least one opening formed in a multi-tier structure of a substrate, disposed in the processing chamber, to a tungsten-containing precursor at a precursor gas flow rate using the gas delivery system, expose the at least one opening of the substrate, disposed in the processing chamber, to a nucleation reducing agent at a nucleation reducing agent flow rate using the gas delivery system. The tungsten-containing precursor and the nucleation reducing agent are alternated cyclically to form a nucleation layer within the at least one opening of the substrate. The system controller is further configured to expose the at least one opening of the substrate, disposed in the processing chamber, to a nitrogen-containing gas, a tungsten-containing gas, and a gapfill reducing agent gas, using the gas delivery system, to produce a non-uniform tungsten nitride passivation layer in the at least one opening, and expose the at least one opening of the substrate, disposed in the processing chamber, to the tungsten-containing gas, using the gas delivery system, to form a fill layer over the nucleation layer and the non-uniform tungsten nitride passivation layer within the at least one opening.

In another embodiment, a substrate processing chamber is provided. The substrate processing chamber includes a chamber lid assembly, one or more sidewalls, a chamber base, a processing volume defined by the chamber lid assembly, the one or more sidewalls, and the chamber base, the processing volume configured to be coupled to a gas delivery system, and a controller coupled to the substrate processing chamber and the gas delivery system and configured to expose at least one opening formed within a substrate disposed within the processing volume to a nitrogen-containing gas, a tungsten-containing gas, and a gapfill reducing agent gas to produce a non-uniform tungsten nitride passivation layer in the at least one opening. The at least one opening includes a lower portion and an upper portion. The upper portion includes a width smaller than a width of the lower portion, and expose the at least one opening of the substrate disposed within the processing volume to the tungsten-containing gas to form a portion of a fill layer over the non-uniform tungsten nitride passivation layer within the at least one opening.

In yet another embodiment, a method of forming a structure on a substrate is provided. The method includes forming a tungsten nucleation layer within at least one opening formed in a multi-tier structure of the substrate, exposing the tungsten nucleation layer to a nitrogen-containing gas, a tungsten-containing gas, and a gapfill reducing agent gas to produce a non-uniform tungsten nitride passivation layer in the at least one opening, and exposing the at least one opening to a tungsten-containing precursor gas to form a fill layer over the tungsten nucleation layer within the at least one opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the present disclosure and are therefore not to be considered limiting of its scope, as the present disclosure may admit to other equally effective embodiments.

FIG. 2 is a schematic view of a processing system that may be used to implement the methods set forth herein, according to certain embodiments.

FIG. 4E-4G are schematic sectional views of a growth suppression deposition process on a portion of a substrate as part of a method described herein, according to certain embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to systems and methods for forming low resistivity tungsten features in a semiconductor device manufacturing scheme using growth suppression techniques.

Traditional thermal treatment approaches to create an inhibition profile, such as a tungsten nitride layer for gap fill or bottom-up fill, on structures typically flow a treatment agent, such as $NF_3$, and carrier gas. The treatment agent can easily diffuse to the bottom of the structure (e.g., channels or vias) with a small incubation gradient, resulting in conformal tungsten growth. Such conformal growth is undesirable as it creates voids in multi-tier structures or high aspect ratio structures, such as structures with aspect ratios of 70:1 or higher.

In the present disclosure, the treatment agent is consumed by a tungsten-containing precursor and a reducing agent combination, such as tungsten fluoride and hydrogen ($WF_6$+ $H_2$), or the reducing agent, e.g., hydrogen ($H_2$), alone, creating poor step coverage by the treatment agent inside the high aspect ratio structures, and thus, providing a more desirable gradient. The resulting tungsten growth within the structures displays a more bottom-up behavior, where the tungsten growth is greatest at the bottom of the structure, due to the better gradient, reducing seam size and even achieving seamless growth.

Figure 1:
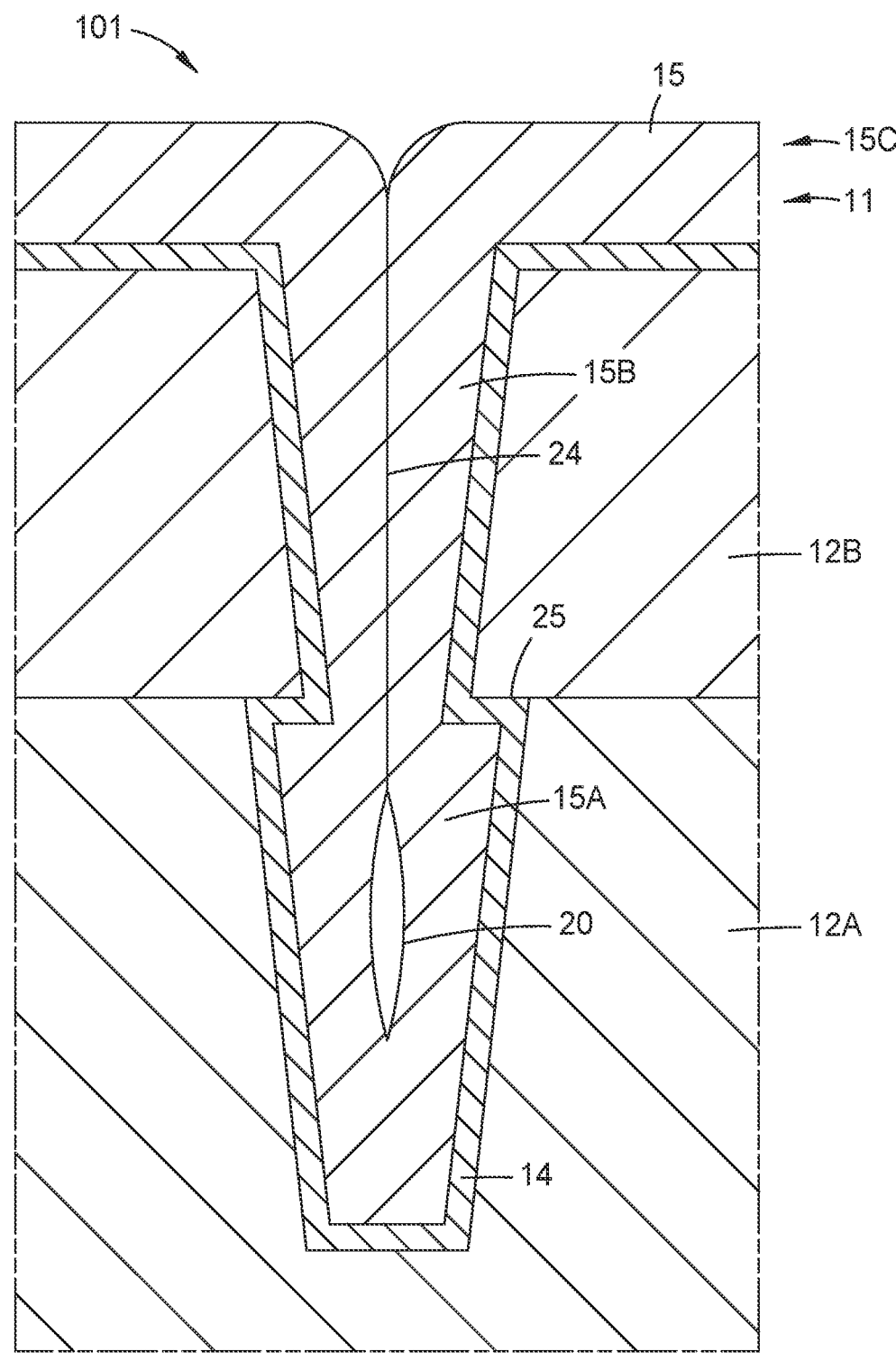
FIG. 1 is a schematic section view of a portion of a substrate illustrating undesirable voiding or seaming in conventionally formed tungsten features.

FIG. 1 is a schematic cross-sectional view of a substrate 101 illustrating an undesirable void 20 formed during a conventional tungsten deposition process. Here, the substrate 101 includes a patterned surface 11 disposed within a plurality of tier layers, such as a first tier layer 12A and a second tier layer 12B. In some embodiments, the first tier layer 12A is a first dielectric layer, e.g., silicon oxide ($SiO_x$), and the second tier layer 12B is a second dielectric layer, e.g., silicon nitride (SiN). In some embodiments, the substrate 101 includes a plurality of alternating first and second tier layers. The patterned surface 11 includes at least one opening having a high aspect ratio opening formed therein (shown filled with a portion of a tungsten layer 15), a barrier material layer 14 deposited on the first tier layer 12A and second tier layer 12B to line the opening, and the tungsten layer 15 deposited on the barrier material layer 14. The tungsten layer 15 illustrated in FIG. 1 is formed using a conventional deposition process, e.g., a chemical vapor deposition (CVD) or atomic layer deposition (ALD) process where tungsten is conformally deposited (grown) on the patterned surface 11 to fill the opening. The tungsten layer 15 forms a tungsten feature 15A within the first tier layer 12A, a tungsten feature 15B within the second tier layer 12B and an overburden of material (tungsten overburden layer 15C) on the field of the patterned surface 11.

In FIG. 1, the opening has a non-uniform profile that is wider at the surface of the substrate 101 and tapers as the opening extends from the surface inwardly into the second tier layer 12B. At an interface 25 of the first and second tier layers, the width of the second tier layer 12B is narrower than the width of the first tier layer 12A disposed inward from the second tier layer 12B. As shown, interface portions of the tungsten layer 15 have grown together to block or "pinch off" the entrance to the opening disposed in the first tier layer 12A before the opening could be completely filled, thus causing the void 20, i.e., an absence of tungsten material, in the tungsten feature 15A. In addition to voids, undesirable seams 24 can occur in tungsten features, as shown within the second tier layer 12B using a conventional tungsten deposition process. The void 20 and seam 24 are vulnerable to corrosion from the chemically active components of tungsten chemical mechanical polishing (CMP) polishing fluid, which may cause undesirable loss of tungsten material from the tungsten features 15A, 15B if the seam 24 or void 20 is exposed during the CMP process.

Accordingly, embodiments herein provide systems and methods that address the conformal tungsten growth within the tier layers, thus improving deposition of the tungsten features into a more desirable bottom-up fill. The methods and systems provided herein are particularly useful for tungsten gapfill for high aspect ratio features, such as about 25:1 or greater, such as about 30:1 to about 150:1, such as about 50:1 to about 80:1. The aspect ratio refers to a ratio of total height to an average width or diameter of the feature.

Generally, the gapfill processing schemes described herein include forming a differential tungsten Growth Suppression Deposition (GSD) profile in feature openings formed in a surface of a substrate, filling the openings with tungsten material according to the GSD profile, and depositing an overburden of tungsten on the field surface of the substrate. Forming the tungsten GSD profile typically includes forming a tungsten nucleation layer and then exposing the tungsten nucleation layer to a GSD gas including a nitrogen-containing gas, a tungsten-containing gas, and a gapfill reducing agent. The nitrogen-containing gas can further include molecules including hydrogen atoms, fluorine atoms, or combinations thereof, such as nitrogen trifluoride, $NH_3$, $N_2H_4$, or combinations thereof. The nitrogen from the nitrogen-containing gas is incorporated into portions of the nucleation layer, e.g., by adsorption of the nitrogen or by reaction with the metallic tungsten of the nucleation layer to form a tungsten nitride (WN) passivation layer. The adsorbed nitrogen or nitrided surface of the tungsten nucleation layer desirably delays (inhibits) tungsten nucleation and thus subsequent tungsten deposition thereon. The tungsten-containing gas, such as tungsten fluoride, and the reducing agent, such as hydrogen gas, when co-flowed with the nitrogen-containing gas, consume the nitrogen-containing gas before it reaches the bottom of the multi-tiered structure, producing a gradient or non-uniformly deposited tungsten nitride passivation layer, e.g., a tungsten nitride passivation layer with poor step coverage inside the structure. Alternatively, different combinations of co-flowed gases, e.g., the hydrogen gas and the tungsten-containing gas, are co-flowed with the nitrogen-containing gas to produce the non-uniformly deposited tungsten nitride passivation layer. For example, co-flowed gases may include tungsten-containing gas, hydrogen gas, and nitrogen-containing gas, hydrogen gas and nitrogen-containing gas, or tungsten-containing gas and nitrogen-containing gas. The non-uniformly deposited passivation layer has the greatest thickness at the top of the structure, e.g., the top opening, and a decreasing thickness further into the structure. The GSD process differs from other methods that flow a nitrogen-containing gas or a nitrogen radical to treat a nucleation surface without a reducing agent or tungsten-containing gas.

The tungsten nucleation and deposition processes of the gapfill processing scheme disclosed herein generally include flowing a tungsten-containing precursor and a nucleation reducing agent into the substrate processing chamber and exposing the substrate surface thereto. The tungsten-containing precursor and the nucleation reducing agent react on the surface of the substrate in one of a chemical vapor deposition (CVD) process, a pulsed CVD process, an atomic layer deposition (ALD) process, or a combination thereof to deposit tungsten material thereon.

Figure 2:
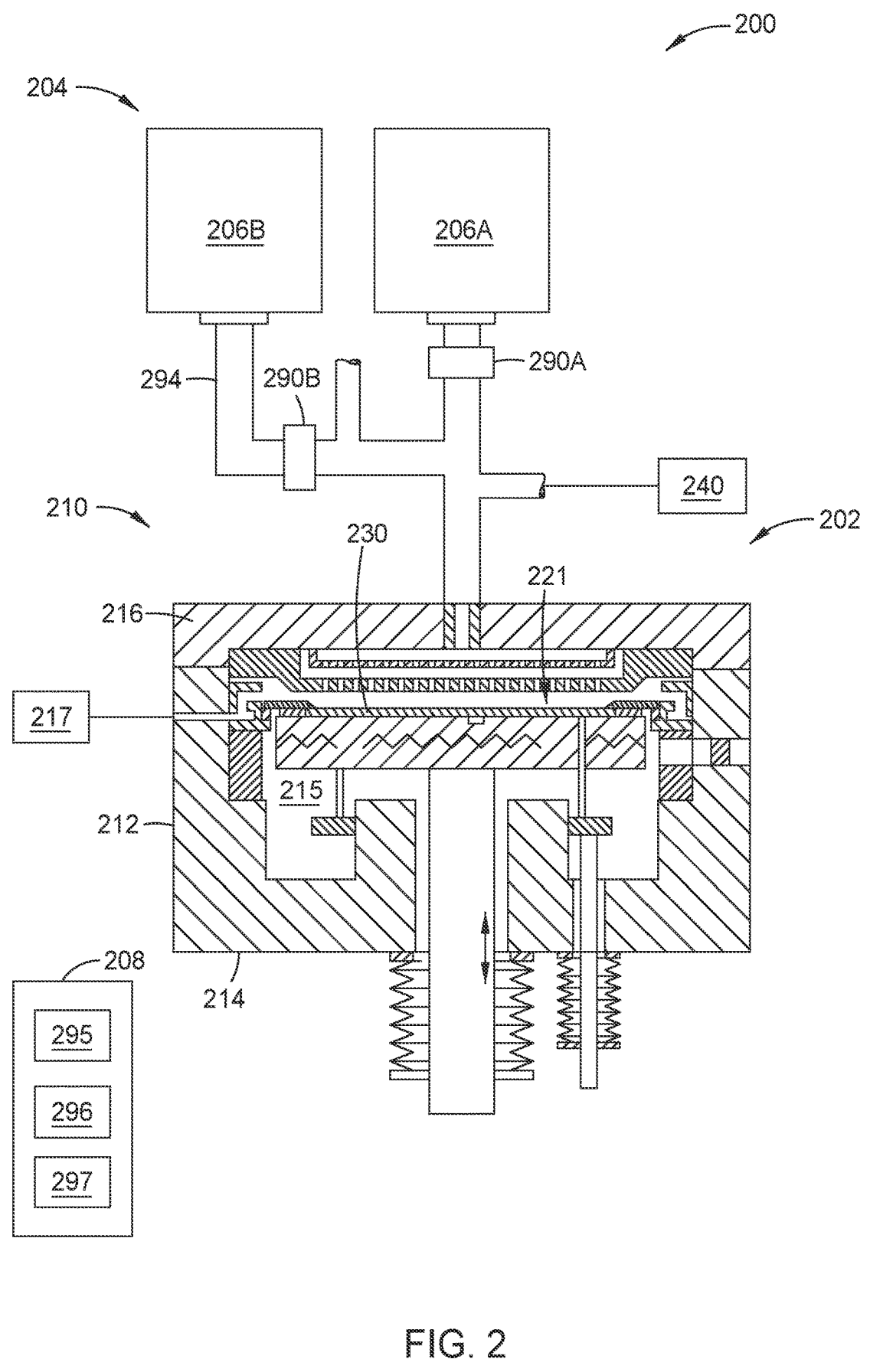

FIG. 2 schematically illustrates a substrate processing system 200 that may be used to perform the bottom-up tungsten gapfill substrate processing methods described herein. Here, the substrate processing system 200 is configured to provide the different processing conditions desired for each of a nucleation process, GSD process, selective gapfill process, and overburden deposition process within a single processing chamber 202, i.e., without transferring a substrate between a plurality of processing chambers.

As shown in FIG. 2, the substrate processing system 200 includes the substrate processing chamber 202, a gas delivery system 204 fluidly coupled to the substrate processing chamber 202, and a system controller 208. The substrate processing chamber 202 includes a chamber lid assembly 210, one or more sidewalls 212, and a chamber base 214, which collectively define a processing volume 215. The processing volume 215 is fluidly coupled to an exhaust 217, such as one or more vacuum pumps, used to maintain the processing volume 215 at sub-atmospheric conditions and to evacuate processing gases and processing by-products therefrom.

The substrate processing system 200 is advantageously configured to perform each of the tungsten nucleation, GSD treatment, and bulk tungsten deposition processes of a void-free and seam-free tungsten gapfill process scheme without removing a substrate 230 from the substrate processing chamber 202. The gases used to perform the individual processes of the gapfill process scheme, and to clean residues from the interior surfaces of the processing chamber, are delivered to the substrate processing chamber 202 using the gas delivery system 204 fluidly coupled thereto and controlled using the system controller 208.

Generally, the gas delivery system 204 includes one or more remote plasma sources, here the first radical generator 206A, the second radical generator 206B, a deposition gas source 240, and a conduit system 294 fluidly coupling the radical generators 206A, 206B and the deposition gas source 240 to the chamber lid assembly 210. Although the gas delivery system 204 shown includes two radical generators 206A, 206B, the processes describe herein could also be practiced using a gas delivery system 204 having only a single radical generator 206A. The gas delivery system 204 further includes a plurality of isolation valves, here first and second valves 290A, 290B, respectively disposed between the radical generators 206A, 206B and the lid plate 216, which may be used to fluidly isolate each of the radical generators 206A, 206B from the substrate processing chamber 202 and from one another.

As shown, the first radical generator 206A is fluidly coupled to the substrate processing chamber 202. The first valve 290A is used to selectively fluidly isolate the first radical generator 206A from the substrate processing chamber 202 and the other portions of the gas delivery system 204. Typically, the first valve 290A is closed during the chamber clean process to prevent activated cleaning gases, e.g., halogen radicals, from flowing into the first radical generator 206A and damaging the surfaces thereof.

The second radical generator 206B is fluidly coupled to the substrate processing chamber 202. The second radical generator 206B is selectively isolated from the substrate processing chamber 202 and from the other portions of the gas delivery system 204 by use of the second valve 290B.

Deposition gases, e.g., tungsten-containing precursors and reducing agents, are delivered from the deposition gas source 240 to the substrate processing chamber 202.

The first and second valves 290A, 290B may be diaphragm valves, such as ultrahigh-purity diaphragm valves including metal alloys that increase corrosion resistance. The first and second valves 290A, 290B may operate in conjunction with a solenoid pilot valve (not shown) controlled by the system controller 208. This configuration allows the first and second valves 294A, 294B to have improved diaphragm-pulse response enabling precise and repeatable pulses and capable of producing pulse widths of 20 milliseconds (ms) or greater.

Operation of the substrate processing system 200 is facilitated by the system controller 208. The system controller 208 includes a programmable central processing unit, here the CPU 295, which is operable with a memory 296 (e.g., non-volatile memory) and support circuits 297. The CPU 295 is one of any form of general-purpose computer processor used in an industrial setting, such as a programmable logic controller (PLC), for controlling various chamber components and sub-processors. The memory 296, coupled to the CPU 295, facilitates the operation of the processing chamber. The support circuits 297 are conventionally coupled to the CPU 295 and comprise cache, clock circuits, input/output subsystems, power supplies, and the like, and combinations thereof coupled to the various components of the substrate processing system 200 to facilitate control of substrate processing operations therewith.

The instructions in memory 296 are in the form of a program product, such as a program that implements the methods of the present disclosure. In one example, the disclosure may be implemented as a program product stored on computer-readable storage media for use with a computer system. The programs of the program product define functions of the embodiments including the methods described herein. Thus, the computer-readable storage media, when carrying computer-readable instructions that direct the functions of the methods described herein, are embodiments of the present disclosure.

The substrate processing system 200 described above may be used to perform each of the nucleation, GSD treatment, and bulk tungsten deposition, thus providing a single-chamber seam-free tungsten gapfill solution.

Figure 3:
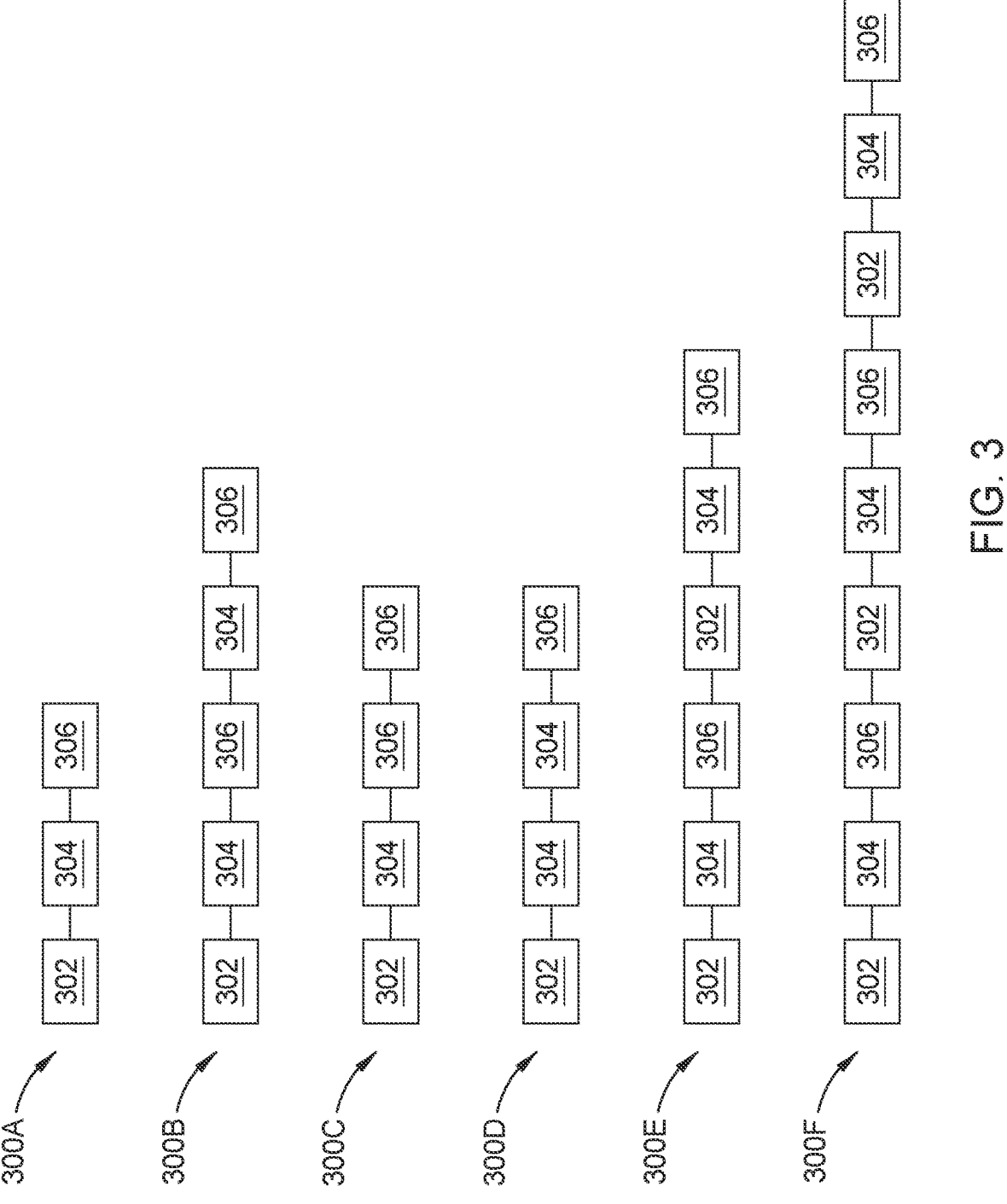
FIG. 3 is a diagram illustrating simplified process flows used to process a substrate, according to certain embodiments.
Figure 4A:
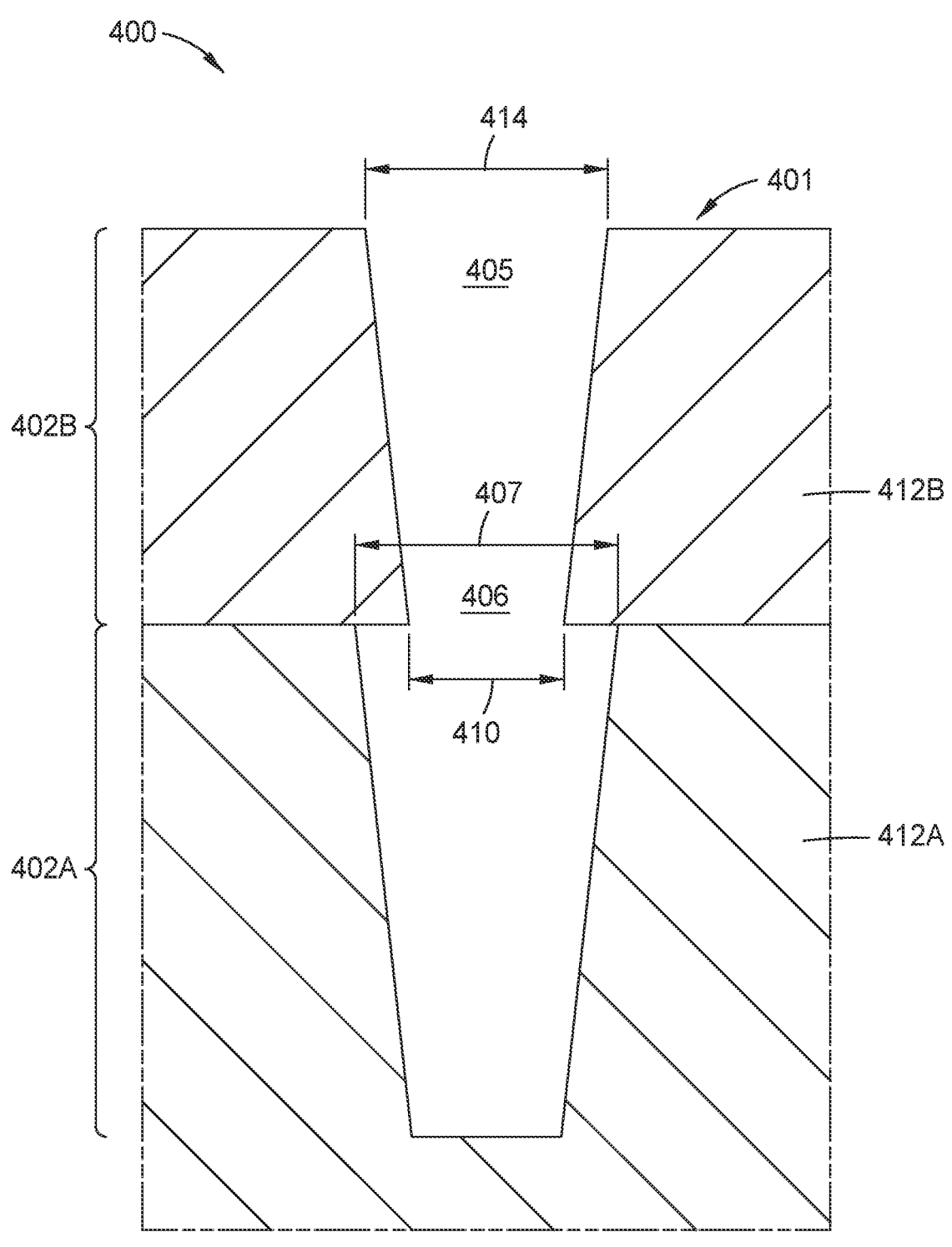
FIG. 4A is a schematic sectional view of a portion of a substrate including a substrate to be processed by a method described herein, according to certain embodiments.
Figure 4B:
FIGS. 4B-4C are schematic sectional views of a portion of a substrate including a substrate processed by a method described herein, according to certain embodiments.

FIG. 3 is a diagram illustrating simplified process flows used to process a substrate according to some embodiments, which may be performed using the substrate processing system 200. FIGS. 4A-4B are schematic sectional views of a portion of a substrate 400 illustrating aspects at different stages of a void-free and seam-free tungsten gapfill process scheme.

The substrate 400 features a patterned surface 401 including a first tier layer 412A and a second tier layer 412B having a plurality of openings 405 (one shown) formed therein. An opening disposed within the first tier layer 412A is referred to as a first tier opening 402A and an opening disposed within the second tier layer 412B is referred to as a second tier opening 402B. The first and second tier openings together form the single contiguous opening 405. The uppermost portion of the first tier opening 402A interfaces the lowermost portion of the second tier opening 402B at an interface 406. In some embodiments, the plurality of openings 405 include one or a combination of high aspect ratio via or trench openings having a width (e.g., each of width 407 and width 414) of about 100 nm to about 400 nm, such as about 200 nm to about 300 nm and a depth (e.g., each of the first tier opening 402A or the second tier opening 402B or either of the first tier opening 402A or the second tier opening 402B) of about 2 μm to about 8 μm, such as about 3 μm to about 6 μm. In some embodiments, the plurality of openings includes at least one opening with a width 410 of a narrowest portion of the opening of about 50 nm to about 200 nm, such as about 75 nm to about 125 nm. In some embodiments, individual openings 405 may have an aspect ratio (depth to width ratio) of about 10:1 or more, such as about 25:1 or more, such as about 30:1 to about 100:1, such as about 40:1 to about 60:1. In some embodiments, the vias or trench openings include aspect ratios of about 20:1 to about 40:1.

The width 407 of the uppermost portion of the first tier opening 402A is greater than the width 410 of the lowermost portion of the second tier opening 402B at the interface 406. In some embodiments, the width 407 is about 5% to about 100% greater than the width 410, such as about 10% greater to about 50% greater. For example, width 410 can be about 50 nm to about 300 nm, such as about 75 nm to about 125 nm and the width of 407 can be about 70 nm to about 400 nm, such as about 150 nm to about 250 nm. Alternatively, the width of 407 of the uppermost portion of the first tier opening 402A is less than the width 410 of the lowermost portion of the second tier opening 402B at the interface 406. In some embodiments, for each tier, a widest portion of the tier, such as the width 414 of the second tier layer 412B is about 5% to about 100% greater than a narrowest portion of the tier, such as the width 410 of the second tier layer 412B, such as about 10% greater to about 50% greater. In some embodiments, a height of the first tier opening 402A is substantially the same, is less than, or greater than a height of the second tier opening 402B. Without being bound by theory, it is believed that sudden differences in opening widths at interfaces can cause a pinching effect. The methods described herein enables a growth behavior that fills openings without the formation of voids.

As shown in FIG. 4B, the patterned surface 401 includes a barrier or adhesion layer 403, e.g., a titanium nitride (TiN) layer, deposited on the first tier layer 412A and the second tier layer 412B to conformally line the opening 405 and facilitate the subsequent deposition of a tungsten nucleation layer 404. In some embodiments, the adhesion layer 403 is deposited to a thickness of between about 20 angstroms (Å) and about 150 Å, such as about 30Å to about 100Å.

Nucleation Layer Deposition

Each of the processes 300A, 300B, 300C, 300D, 300E, and 300F include forming the nucleation layer 404 over the substrate 400 depicted as activity 302. The nucleation layer can be formed using any process capable of forming a tungsten nucleation layer. In some embodiments, prior to forming the nucleation layer 404, the substrate is exposed in a boron-containing gas, such as $B_2H_6$, such as for a soak time of about 5 seconds or greater, such as about 10 seconds or greater, such as about 20 seconds to 30 seconds. In some embodiments, the nucleation layer 404 is deposited over the adhesion layer 403.

The nucleation layer can be formed using atomic layer deposition (ALD) of a tungsten-containing nucleation layer, or a physical vapor deposition (PVD) process. Forming the nucleation layer includes exposing the substrate 400 to a tungsten-containing precursor gas at a first precursor gas flow rate. In some embodiments, forming the nucleation layer includes exposing the substrate to a nucleation reducing agent. The nucleation reducing agent includes boron and is introduced to the process chamber at a nucleation reducing agent flow rate. In some embodiments, the tungsten-containing precursor gas and the nucleation reducing agent are alternated cyclically to form a nucleation layer over the substrate within at least one opening of the substrate at the nucleation reducing agent flow rate. In some embodiments, the nucleation reducing agent and the tungsten-containing precursor gas are cyclically alternated, beginning with either the nucleation reducing agent or the tungsten-containing precursor, and ending with the same beginning gas or ending with a gas different from the beginning gas. In some embodiments, the nucleation reducing agent or the tungsten-containing precursor are cyclically alternated beginning with tungsten-containing precursor and ending in the nucleation reducing agent. A portion of a substrate 400 having the nucleation layer 404 formed thereon is schematically illustrated in FIG. 4B.

In some embodiments, the nucleation layer 404 is deposited using an atomic layer deposition (ALD) process. The ALD process includes repeating cycles of alternately exposing the substrate 400 to a tungsten-containing precursor and exposing the substrate 400 to a nucleation reducing agent. In some embodiments, the processing region 221 is purged between the alternating exposures. In some embodiments, the process region 221 is continuously purged. Examples of suitable tungsten-containing precursors include tungsten halides, such as tungsten hexafluoride ($WF_6$), tungsten hexachloride ($WCl_6$), or combinations thereof. In some embodiments, the tungsten-containing precursor includes $WF_6$, and the nucleation reducing agent includes a boron-containing agent, such as $B_2H_6$. In some embodiments, the tungsten-containing precursor comprises an organometallic precursor or a fluorine-free precursor, e.g., MDNOW (methylcyclo-pentadienyl-dicarbonylnitrosyl-tungsten), EDNOW (ethyl-cyclopentadienyl-dicarbonylnitrosyl-tungsten), tungsten hexacarbonyl ($W(CO)_6$), or combinations thereof.

During the nucleation process, the processing volume 215 is maintained at a pressure of less than about 120 Torr, such as of between about 900 mTorr and about 120 Torr, between about 1 Torr and about 100 Torr, or for example, between about 1 Torr and about 50 Torr. Exposing the substrate 400 to the tungsten-containing precursor includes flowing the tungsten-containing precursor into the processing region 221 from the deposition gas source 240 at a flow rate of about 1000 sccm or less, such as about 10 sccm to about 500 sccm, or about 20 sccm to about 200 sccm. Exposing the substrate 400 to the nucleation reducing agent includes flowing the nucleation reducing agent into the processing region 221 from the deposition gas source 240 at a flow rate of about 200 sccm to about 1000 sccm, such as between about 300 sccm and about 750 sccm.

It should be noted that the flow rates for the various deposition and treatment processes described herein are for a substrate processing system 200 configured to process a 300 mm diameter substrate. Appropriate scaling may be used for processing systems configured to process different-sized substrates.

The tungsten-containing precursor and the nucleation reducing agent are each flowed into the processing region 221 for a duration of between about 0.1 seconds and about 10 seconds, such as between about 0.5 seconds and about 5 seconds. The processing region 221 may be purged between the alternating exposures by flowing a purge gas, such as argon (Ar) or hydrogen gas, into the processing region 221 for a duration of between about 0.1 seconds and about 10 seconds, such as between about 0.5 seconds and about 5 seconds. The purge gas may be delivered from the deposition gas source 240 or from the bypass gas source (not shown). Typically, repeating cycles of the nucleation process continues until the nucleation layer 404 has a thickness of between about 10Å and about 200 Å, such as between about 10Å and about 150 Å, or between about 20Å and about 150 Å. The nucleation layer 404 is disposed along sidewalls of the opening 405, such as over the barrier or adhesion layer 403.

In some embodiments, immediately following each nucleation activity 302, a tungsten gapfill material 408 (FIG. 4B) is optionally deposited, at least partially, into the plurality of openings 405, in activity 306.

In one embodiment, the tungsten gapfill material 408 is formed using a chemical vapor deposition (CVD) process comprising concurrently flowing (co-flowing) a tungsten-containing gas, and a gapfill reducing agent into the processing region 221 and exposing the substrate 400 thereto. Examples of suitable tungsten-containing gases include tungsten halides, such as tungsten hexafluoride ($WF_6$), tungsten hexachloride ($WCl_6$), or combinations thereof. In some embodiments, the tungsten-containing precursor includes $WF_6$, and the nucleation reducing agent includes a hydrogen-containing agent, such as $H_2$. In some embodiments, the tungsten gapfill material 408 partially fills the plurality of openings 405.

The tungsten-containing gas is flowed into the processing region 221 at a rate of between about 10 sccm and about 1200 sccm, or more than about 50 sccm, or less than about 1000 sccm, or between about 100 sccm and about 900 sccm. The gapfill reducing agent is flowed into the processing region 221 at a rate of more than about 500 sccm, such as more than about 750 sccm, more than about 1000 sccm, or between about 500 sccm and about 10000 sccm, such as between about 1000 sccm and about 9000 sccm, or between about 1000 sccm and about 8000 sccm.

In some embodiments, the tungsten gapfill CVD process conditions are selected to provide a tungsten feature having a relativity low residual film stress when compared to conventional tungsten CVD processes. For example, in some embodiments, the tungsten gapfill CVD process includes heating the substrate to a temperature of about 250° C. or more, such as about 300° C. or more, or between about 250° C. and about 600° C., or between about 300° C. and about 500° C. During the CVD process, the processing volume 215 is typically maintained at a pressure of less than about 500 Torr, less than about 600 Torr, less than about 500 Torr, less than about 400 Torr, or between about 1 Torr and about 500 Torr, such as between about 1 Torr and about 450 Torr, or between about 1 Torr and about 400 Torr, or for example, between about 1 Torr and about 300 Torr.

In another embodiment, the tungsten gapfill material 408 is deposited in activity 306 using an atomic layer deposition (ALD) process. The tungsten gapfill ALD process includes repeating cycles of alternately exposing the substrate 400 to a tungsten-containing gas and a gapfill reducing agent and purging the processing region 221 between the alternating exposures.

The tungsten-containing gas and the gapfill reducing agent are each flowed into the processing region 221 for a duration of between about 0.1 seconds and about 10 seconds, such as between about 0.5 seconds and about 5 seconds. The processing region 221 is typically purged between the alternating exposures by flowing an inert purge gas, such as argon (Ar) or hydrogen, into the processing region 221 for a duration of between about 0.1 seconds and about 10 seconds, such as between about 0.5 seconds and about 5 seconds. The purge gas may be delivered from the deposition gas source 240 or from the bypass gas source (not shown).

In other embodiments, the tungsten gapfill material 408 is deposited using a pulsed CVD method that includes repeating cycles of alternately exposing the substrate 400 to a tungsten-containing gas and a gapfill reducing agent without purging the processing region 221. The processing conditions for the tungsten gapfill pulsed CVD method may be the same, substantially the same, or within the same ranges as those described above for the tungsten gapfill ALD process.

In some embodiments, the nucleation layer 404 and the tungsten gapfill material 408 are monolithic and do not have an interface therebetween. The tungsten gapfill material 408 and the nucleation layer 404 together form a tungsten-containing layer. The thickness of the tungsten-containing layer is measured from an interface between the adhesive layer and the nucleation layer to a center of the tungsten gapfill material 408.

After forming the nucleation layer 404 and optional tungsten gap fill material 408, a growth suppression deposition (GSD) profile is formed by exposing the sidewalls of the openings to a nitrogen-containing gas (e.g., $NF_3$, $NH_3$, or $N_2H_4$), a tungsten-containing gas, such as $WF_6$, a gapfill reducing agent gas, such as $H_2$, or combinations thereof. Several combinations of processes is described with reference to process 300A, 300B, 300C, 300D, 300E, and 300F. Other combinations are also contemplated.

Process 300A—Nitrogen-Containing Gas Treatment

As shown in FIG. 3, process 300A includes activity 304, after forming the nucleation layer 404 (e.g., described in activity 302), treating the nucleation layer 404 or an outer surface of the tungsten gapfill material 408 (e.g., after optional activity 306) to non-uniformly inhibit tungsten deposition on a field surface of the substrate 400 at interfaces between adjacent tiers (e.g., necking points). Activity 304 forms a GSD profile in the plurality of openings 405 by use of a GSD process. Forming the GSD profile includes exposing the sidewalls of the openings to a GSD gas that includes a nitrogen-containing gas (e.g., $NF_3$, $NH_3$, or $N_2H_4$), a tungsten-containing gas (e.g., $WF_6$), and a reducing gas (e.g., $H_2$).

Exposing the openings to the GSD gas includes co-flowing the nitrogen-containing gas, the tungsten-containing gas, and the gapfill reducing agent gas in combination before flowing the tungsten-containing gas and the gapfill reducing agent for a bulking step. For example, the nitrogen-containing gas, the tungsten-containing gas, and the gapfill reducing agent gas may be co-flowed at the same time. Alternatively, the nitrogen-containing gas is co-flowed at the same time as the gapfill reducing agent gas, before flowing the tungsten-containing gas and gapfill reducing agent gas together without the nitrogen-containing gas. The nitrogen-containing gas may also be co-flowed with the tungsten-containing gas before flowing the tungsten-containing gas and gapfill reducing agent gas without the nitrogen-containing gas. In some embodiments, the temperature of the substrate is maintained at about 200° C. to about 600° C., such as about 300° C. to about 500° C., such as about 400° C. to about 450° C. In some embodiments, nitrogen-containing gas is flowed at a rate of about 0.5 sccm to about 1000 sccm, such as about 5 sccm to about 100 sccm, such as about 100 sccm to about 500 sccm, such as about 300 sccm to about 500 sccm, or about 600 sccm to about 800 sccm. In some embodiments, the nitrogen-containing gas is combined with an inert carrier gas, such as Ar, He, or a combination thereof, to form a nitrogen-containing mixture. Alternatively, the nitrogen-containing gas may be flowed into the processing chamber without the carrier gas, e.g., introducing a flow of the pure nitrogen-containing gas. For example, pure $NF_3$ may be flowed into the processing chamber as part of the GSD gas without Ar as a carrier gas. Removing the carrier gas from the nitrogen-containing gas further extends the process window with a stronger incubation while lowering resistivity. The flow rate of the nitrogen-containing gas is controlled and may be pulsed by a diaphragm valve, e.g., the first valve 294A, to provide precise control of its dosage into the processing volume. The tungsten-containing gas is flowed at a rate of about 50 sccm to about 2 liters (L), such as about 100 sccm to about 1.5 L. The gapfill reducing agent gas is flowed at a rate of about 0.5 L to about 10 L, such as about 1 L and about 8 L, such as about 2 L and about 6 L.

Figure 4C:
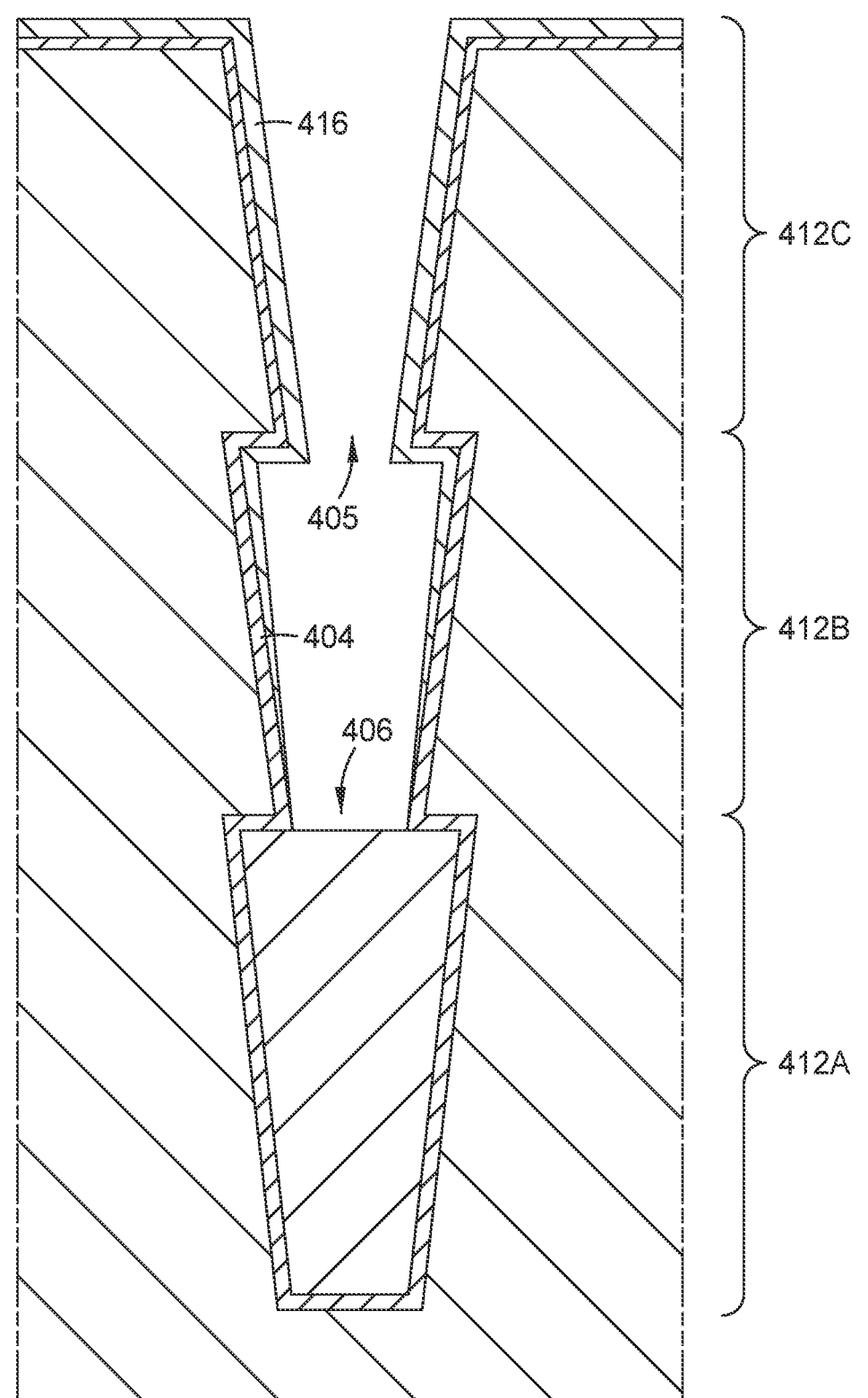

The disclosed GSD treatment can create better nitrogen-containing gas gradients inside structures, resulting in more desirable passivation gradients on the sidewalls of the structures. The addition of the tungsten-containing gas and the gapfill reducing agent gas increasingly consumes the nitrogen-containing gas as the nitrogen-containing gas reaches bottom portions of the tier layers, e.g., the first tier layer 412A, producing a non-uniform tungsten nitride passivation layer 416 that is thicker near the top opening 405 than the interface 406. This allows subsequent tungsten gap fill material 408, such as in activity 306, to deposit more readily on the sidewall portions with the thinner portions of the tungsten nitride passivation layer 416, e.g., near the bottom of the first tier layer 412A, as shown in FIG. 4C. The tungsten-containing gas also protects the substrate surface from being etched by the nitrogen-containing gas. The GSD process further improves incubation under high pressure, such as pressures greater than 40 Torr, and allows for an in-situ multiple pressure process in one chamber. Additionally, the GSD process provides a wider operation window in allowing higher flow of the nitrogen-containing gas without undesired etching, allowing for lower bulk film stress, decreasing the depassivation time before a tungsten fill layer may be deposited thereon After the GSD treatment described in activity 304, a tungsten gap fill material 408 is formed in the opening at activity 306. After the tungsten gap fill described in activity 306, an optional overburden tungsten layer may be deposited on the patterned surface 401 by flowing the tungsten-containing gas and the gapfill reducing agent gas.

Figure 4D:
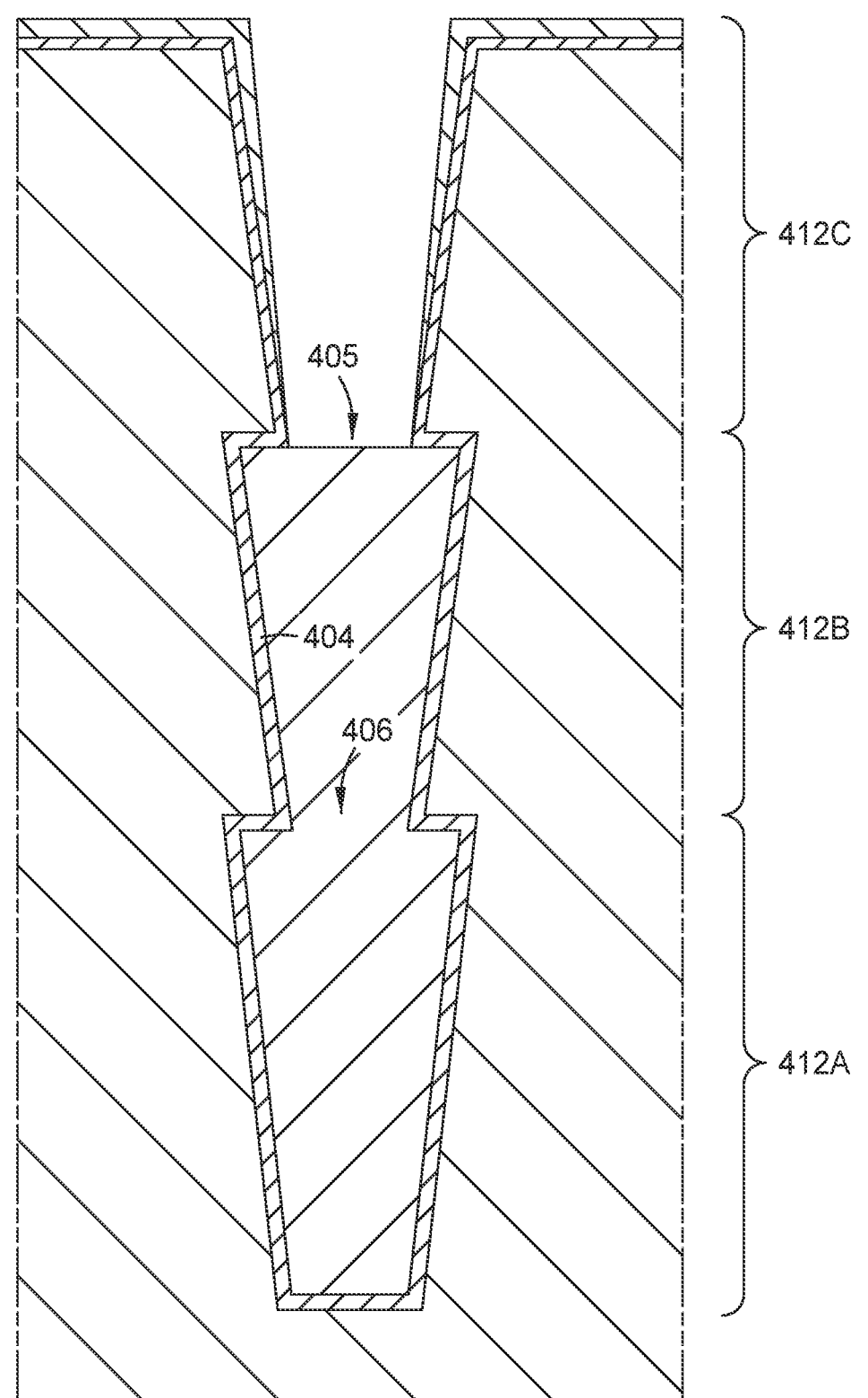
FIGS. 4D-4E are schematic sectional views of a growth suppression deposition process on a portion of a substrate as part of a method described herein, according to certain embodiments.
Figure 4E:
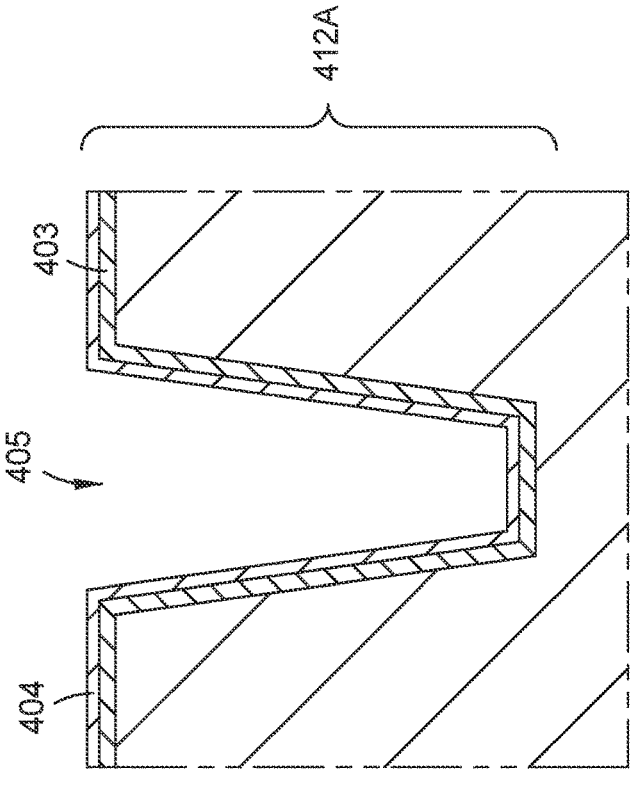
Figure 4E:
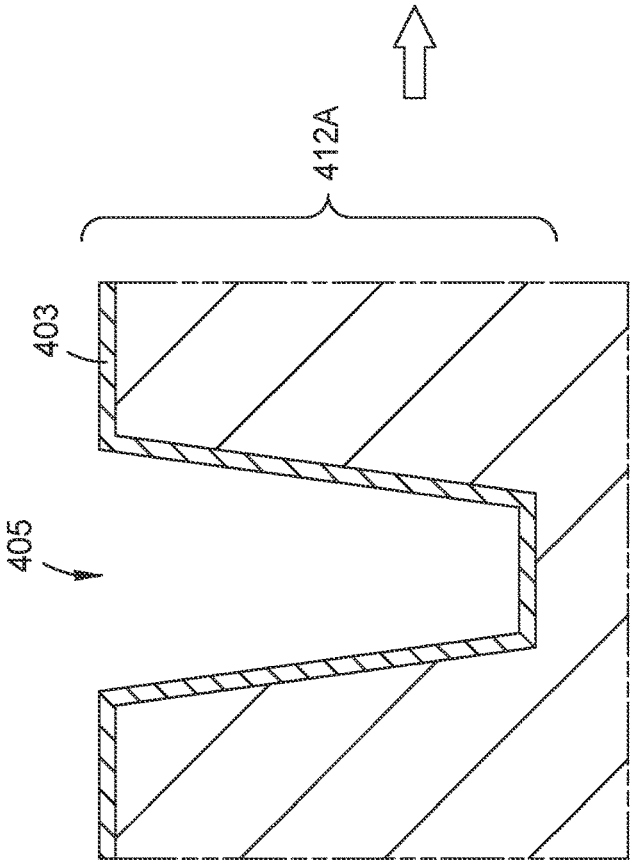
Figure 4F:
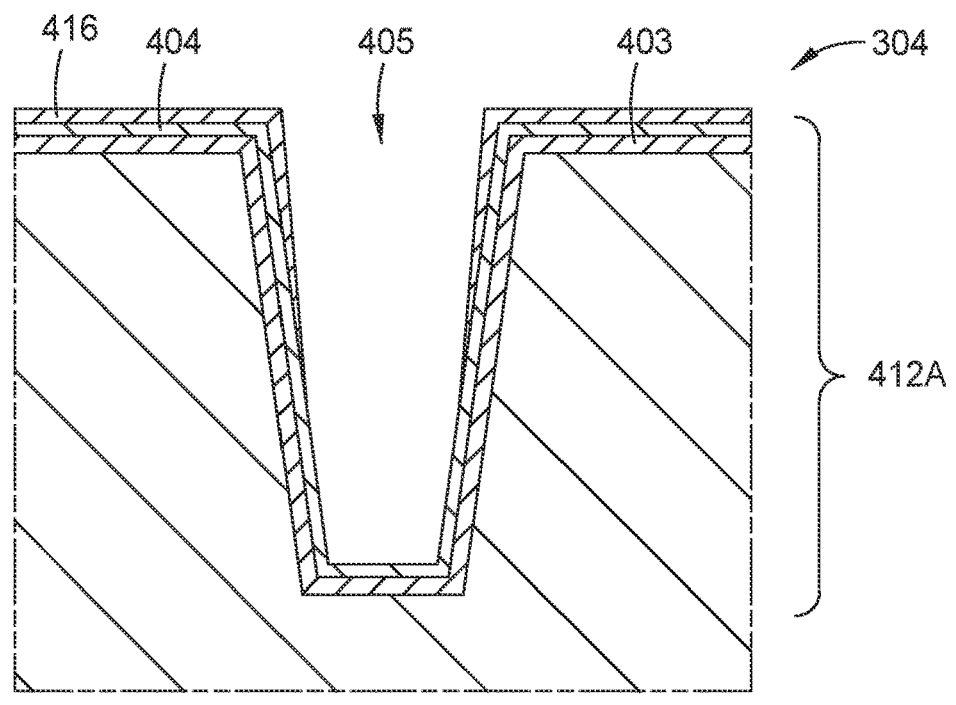
Figure 4G:
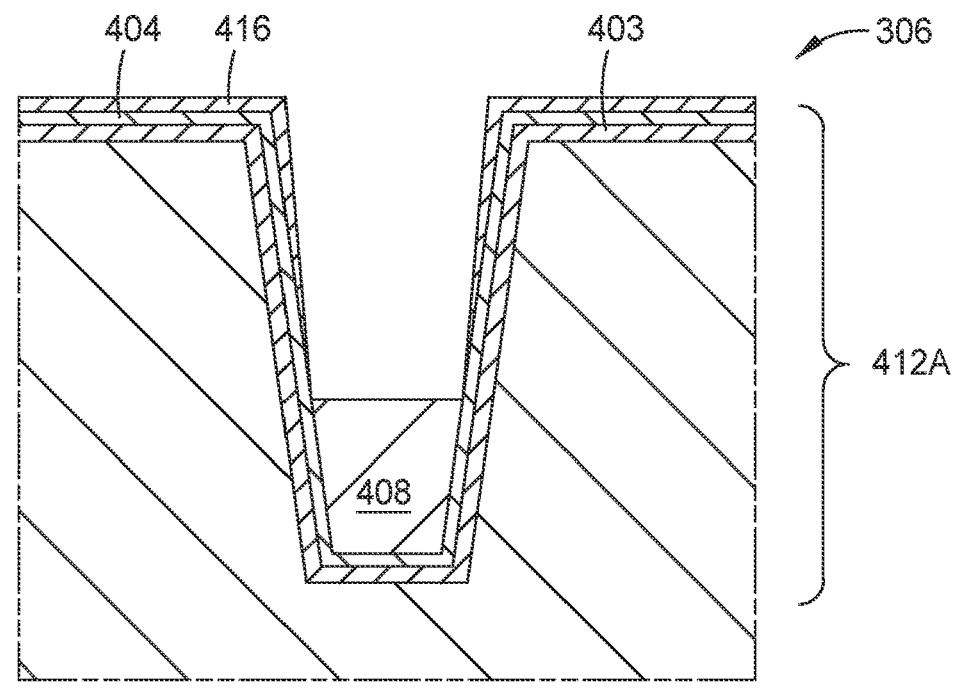

In some embodiments, as shown in process 300B, activity 304 and activity 306 can be repeated one or more times, such as once, twice, or more until the openings are filled. As shown in FIGS. 4D-4E, multiple cycles of activities 304 and 306 are used in a two-tier process. FIGS. 4F-4G show a cycle of activities 304 and 306 in a one-tier process. Further, multiple cycles of activities 304 and 306 may be used in a multi-tier process.

Process 300B—Growth Suppression Deposition Treatment+Additional Growth Suppression Deposition and Deposition Similar to process 300A, process 300B includes activity 302, activity 304 and activity 306. After activity 306, one or more cycles of activities 304 and 306 may be repeated.

Process 300C—Growth Suppression Deposition Treatment+Additional Tungsten Growth Similar to process 300A, process 300C includes activity 302 (optional activity 306 immediately following activity 302), activity 304, activity 306, and an additional cycle of activity 306 for further gap fill or to produce an overburden layer.

Process 300D—Growth Suppression Deposition Treatment+Additional Growth Suppression Deposition Process 300D includes activity 302 (optional activity 306 immediately following activity 302), activity 304 and activity 306. Before activity 306, an additional GSD treatment activity 304 is performed, such as to enhance passivation of the sidewalls of the first tier layer 412A, the second tier layer 412B, or the third tier layer 412C (FIGS. 4D-4E). For example, enhancing the tungsten nitride passivation layer 416 may include deepening the reach of the tungsten nitride passivation layer 416, e.g., extending the tungsten nitride passivation layer 416 into the first tier layer 412A in multi-tier structures, or to thicken the tungsten nitride passivation layer 416 generally.

Process 300E—Growth Suppression Deposition Treatment+Additional Nucleation+Growth Suppression Deposition Treatment Process 300E includes activity 302 (optional activity 306 immediately following activity 302), activity 304 and activity 306. After activity 306, an additional nucleation activity 302 is performed, followed by second iteration of activity 304 and activity 306. Additional iterations of activity 302, activity 304, and activity 306, and combinations thereof are also contemplated thereafter.

Process 300F—Growth Suppression Deposition Treatment+Additional Nucleation+Growth Suppression Deposition+Additional Nucleation+Growth Suppression Deposition Treatment Similar to process 300E, process 300F includes activity 302 (optional activity 306 immediately following activity 302), activity 304, and activity 306. After activity 306, an additional nucleation activity 302 is performed, followed by a second activity 304, followed by a second tungsten gapfill for activity 306. An additional iteration of activity 302, activity 304, and activity 306 is shown.

In a typical semiconductor manufacturing scheme, a chemical mechanical polishing (CMP) process may be used to remove an overburden of tungsten material (and the barrier layer disposed there below) from the field surface of the substrate following depositing the tungsten gapfill material 408 into the plurality of openings 405.

The present disclosure provides systems and methods for improved tungsten gap fill, particularly for multi-tier or high aspect ratio structures. The present disclosure provides a growth suppression deposition treatment process that co-flows a nitrogen-containing gas, a tungsten-containing gas, and a reducing agent to produce a passivation layer with a non-uniform gradient on the structure, such that the passivation layer is thickest at the top of the structure and progressively gets thinner deeper into the structure, e.g., at a bottom or first tier layer. The non-uniform tungsten nitride passivation layer allows for tungsten features to be formed in the structure with a bottom-up behavior, e.g., filling the bottom or first tier layer of the structure first, to produce a tungsten gap fill with seamless growth.

When introducing elements of the present disclosure or exemplary aspects or embodiments thereof, the articles "a," "an," "the" and "said" are intended to mean that there are one or more of the elements.

The terms "comprising," "including" and "having" are intended to be inclusive and mean that there may be additional elements other than the listed elements.

The term "coupled" is used herein to refer to the direct or indirect coupling between two objects. For example, if object A physically touches object B and object B touches object C, the objects A and C may still be considered coupled to one another—even if objects A and C do not directly physically touch each other. For instance, a first object may be coupled to a second object even though the first object is never directly in physical contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A substrate processing system, comprising:
a processing chamber;
a gas delivery system fluidly coupled to the processing chamber; and
a system controller configured to:
expose at least one opening formed in a multi-tier structure of a substrate, disposed in the processing chamber, to a tungsten-containing precursor at a precursor gas flow rate using the gas delivery system;
expose the at least one opening of the substrate, disposed in the processing chamber, to a nucleation reducing agent at a nucleation reducing agent flow rate using the gas delivery system, wherein the tungsten-containing precursor and the nucleation reducing agent are alternated cyclically to form a nucleation layer within the at least one opening of the substrate;
expose the at least one opening of the substrate, disposed in the processing chamber, to a nitrogen-containing gas, a tungsten-containing gas, and a gapfill reducing agent gas, using the gas delivery system, to produce a non-uniform tungsten nitride passivation layer in the at least one opening; and
expose the at least one opening of the substrate, disposed in the processing chamber, to the tungsten-containing gas, using the gas delivery system, to form a fill layer over the nucleation layer and the non-uniform tungsten nitride passivation layer within the at least one opening.

2. The substrate processing system of claim 1, wherein the nitrogen-containing gas and the tungsten-containing gas are co-flowed.

3. The substrate processing system of claim 1, wherein the nitrogen-containing gas and the gapfill reducing agent gas are co-flowed.

4. The substrate processing system of claim 1, wherein the nitrogen-containing gas, the tungsten-containing gas, and the gapfill reducing agent gas are co-flowed.

5. The substrate processing system of claim 1, wherein a flow of the nitrogen-containing gas is controlled by a first valve capable of producing pulse widths of 20 milliseconds.

6. The substrate processing system of claim 5, wherein the nitrogen-containing gas is co-flowed with the gapfill reducing agent gas before the tungsten-containing gas and the gapfill reducing agent gas are co-flowed.

7. The substrate processing system of claim 6, wherein the nitrogen-containing gas is co-flowed with the tungsten-containing gas before the tungsten-containing gas and the gapfill reducing agent gas are co-flowed.

8. A substrate processing chamber, comprising:
a chamber lid assembly;
one or more sidewalls;
a chamber base;
a processing volume defined by the chamber lid assembly, the one or more sidewalls, and the chamber base, the processing volume configured to be coupled to a gas delivery system; and
a controller coupled to the substrate processing chamber and the gas delivery system and configured to:
expose at least one opening formed within a substrate disposed within the processing volume to a nitrogen-containing gas, a tungsten-containing gas, and a gapfill reducing agent gas to produce a non-uniform tungsten nitride passivation layer in the at least one opening, wherein the at least one opening comprises a lower portion and an upper portion, wherein the upper portion comprises a width smaller than a width of the lower portion; and
expose the at least one opening of the substrate disposed within the processing volume to the tungsten-containing gas to form a portion of a fill layer over the non-uniform tungsten nitride passivation layer within the at least one opening.

9. The substrate processing chamber of claim 8, wherein the nitrogen-containing gas and the tungsten-containing gas are co-flowed.

10. The substrate processing chamber of claim 8, wherein the nitrogen-containing gas and the gapfill reducing agent gas are co-flowed.

11. The substrate processing chamber of claim 8, wherein the nitrogen-containing gas, the tungsten-containing gas, and the gapfill reducing agent gas are co-flowed.

12. The substrate processing chamber of claim 8, wherein the at least one opening of the substrate is disposed within two or more tier layers, wherein a first tier layer interfaces a second tier layer at an interface, wherein a width of an opening within the second tier layer at the interface is narrower than a width of an opening within the first tier layer at the interface.

13. The substrate processing chamber of claim 8, wherein a flow of the nitrogen-containing gas is pulsed at a pulse width.

14. The substrate processing chamber of claim 8, wherein the tungsten-containing gas includes tungsten fluoride.

15. The substrate processing chamber of claim 8, wherein the nitrogen-containing gas is selected from the group consisting of $NF_3$, $NH_3$, $N_2H_4$, and combinations thereof.

16. A method of forming a structure on a substrate, comprising:

forming a tungsten nucleation layer within at least one opening formed in a multi-tier structure of the substrate;

exposing the tungsten nucleation layer to a nitrogen-containing gas, a tungsten-containing gas, and a gapfill reducing agent gas to produce a non-uniform tungsten nitride passivation layer in the at least one opening; and exposing the at least one opening to a tungsten-containing precursor gas to form a fill layer over the tungsten nucleation layer within the at least one opening.

17. The method of claim 16, wherein the nitrogen-containing gas and the tungsten-containing gas are co-flowed.

18. The method of claim 16, wherein the nitrogen-containing gas and the gapfill reducing agent gas are co-flowed.

19. The method of claim 16, wherein the nitrogen-containing gas, the tungsten-containing gas, and the gapfill reducing agent gas are co-flowed.

20. The method of claim 19, wherein exposing the at least one opening to the nitrogen-containing gas comprises pulsing the nitrogen-containing gas using a diaphragm valve capable of producing pulse widths of 20 milliseconds.

* * * * *